62-90 SR
F331D XR RE 26,612

THERMOELECTRIC APPARATUS

Original Filed Dec. 18, 1964

THERMOELECTRIC APPARATUS

Original Filed Dec. 18, 1964

WITNESSES:
John L. Chopp
James F. Young

INVENTOR
Cecil J. Mole
BY Zigmund J. Jerman
ATTORNEY

United States Patent Office

Re. 26,612
Reissued June 24, 1969

26,612
THERMOELECTRIC APPARATUS

Cecil J. Mole, Murrysville, Pa., assignor to Westinghouse Electric Corporation, Pittsburgh, Pa., a corporation of Pennsylvania Original No. 3,213,630, dated Oct. 26, 1965, Ser. No. 419,405, Dec. 18, 1964. Application for reissue Mar. 15, 1967, Ser. No. 672,941
Int. Cl. F25b *21/02*
U.S. Cl. 62—3 8 Claims

Matter enclosed in heavy brackets [ ] appears in the original patent but forms no part of this reissue specification; matter printed in italics indicates the additions made by reissue.

*ABSTRACT OF THE DISCLOSURE*

*A direct transfer apparatus for the efficient dehumidification of air is provided wherein at least three electrically conducting heat transfer means are mounted in tandem and having layers of thermoelectric material disposed between and electrically and thermally coupled to adjacent ones of the heat transfer means to provide alternate heating and cooling in alternate adjacent heat transfer means. Conduit means form a flow path through the dehumidifier to cause air flow first past the cooled heat transfer means and then past the heated heat transfer means.*

The present invention is directed generally to thermoelectric apparatus and more particularly to the construction of new and efficient air-to-air devices for varying the temperature of one of the fluid media or for producing through the use of thermoelectric effects, electrical power.

In its more specific aspects, this invention is also directed to the construction of an improved air-to-air device for dehumidifying application. In addition, this invention is directed to a new and improved arrangement for mounting the thermoelectric layers of the thermoelectric apparatus to promote the more efficient use thereof while concurrently reducing the possibility of electrical arcing therein.

In copending applications Serial No. 320,160, filed October 30, 1963, entitled "Thermoelectric Heat Pumping Apparatus," Serial No. 332,010, filed December 20, 1963, and Ser No. 331,997, filed December 20, 1963, both entitled "Thermoelectric Apparatus," of which the present inventor is a coinventor, and which have been assigned to the same assignee as this invention, there have been described thermoelectric arrangements of the liquid-to-liquid and liquid-to-air types incorporating a novel approach or principle for obtaining high efficiency at relatively low cost and for utilizing relatively small amounts of thermoelectric material. The principle of operation of these devices is known as "direct transfer" wherein there is provided in the thermoelectric apparatus a heat flow path having no electrical or thermal insulation therein. With direct transfer devices, substantially all of the cooling effects and heating effects produced at the thermoelectric cold and hot junctions are transferred directly to the cooled and heated media of the thermoelectric heat exchanger. In the present invention there is provided a thermoelectric apparatus of the air-to-air type which embodies the direct transfer principles to produce an air-to-air arrangement having all of the advantages of high efficiency, low cost and low material utilizations of direct transfer devices.

Within the contemplation of this invention is also the provision of an air-to-air electrical power producing apparatus utilizing thermoelectric effects for the direct production of electricity.

Also within the contemplation of this invention is the provision of an air-to-air thermoelectric device of the "direct transfer" type applied for dehumidification of air.

Accordingly it is an object of this invention to provide a new and improved thermoelectric heat exchange device having no electrical insulation in the heat flow path and being of the air-to-air type.

Still another object of this invention is to provide a new and improved thermoelectric generating device of the air-to-air type which promotes the efficient generation of electrical power.

A further object of this invention is to provide a thermoelectric device having a new and improved positioning arrangement for the thermoelectric material to minimize the possibility of electrical arcing.

A still further object of this invention is to provide a new and improved air-to-air thermoelectric exchange device for use as a dehumidifier.

Briefly, the present invention accomplishes the above-cited objects by providing an air-to-air thermoelectric construction or thermopile wherein there is provided a plurality of separated air flow circuits with at least one of the circuits being coupled in heat exchange relationship with cooled heat exchange members and the remaining circuits being coupled in heat exchange relationship with heated heat exchange members. The heat exchange members for all of the circuits form a part of the electrical flow path of the thermoelectric construction thereby resulting in an arrangement wherein no electrical thermal insulation is required in the heat flow paths between the thermoelectric layers and the heated and cooled heat exchangers. In essence, the various heat exchangers of the thermoelectric construction actually form the hot and cold junction members of the thermopile. Insulating means are positioned in the thermopile to separate electrically adjacent ones of the thermoelectric junctions and thermoelectric layers from one another. This arrangement of insulating material results in a current flow path which extends through each of the thermoelectric layers and junctions of the thermopile in a generally sinusoidal manner.

In accordance with the invention there is also provided herein an arrangement of the air-to-air thermoelectric device of this invention for use in the dehumidification of air so that the separated heated and cooled flow paths through the thermopile are connected in series and results in the removal of moisture contained in the air flowing therethrough.

One of the advantages of a direct transfer thermoelectric construction is the provision of a thermopile wherein relatively thin thermoelectric layers are positioned between closely located yet spaced junction members. The closely spaced junction members promote the possibility of arcing therebetween to bypass the thermoelectric layers. Within the contemplation of this invention is the provision of a pedestal-type mounting for thermoelectric layers between adjacent junction members to eliminate the possibility of arcing.

Further objects and advantages of this invention and features of novelty which characterize the invention will be pointed out in particularity in the claims annexed to and forming a part of the specification.

For a better understanding of this invention reference may be had to the accompanying drawings, in which.

Figure 2:
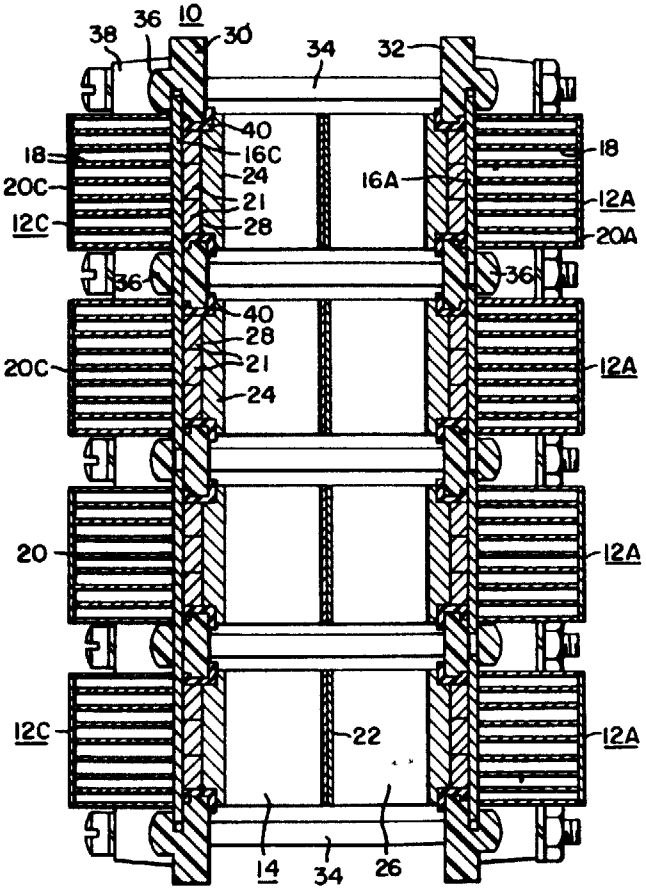
FIG. 2 is a sectional view of the thermoelectric heat exchange apparatus of FIG. 1 and taken along the lines II—II thereof.

Referring now to the embodiment of this invention illustrated in FIGS. 1 through 4, there is shown a thermopile 10 constructed in accordance with the principles of this invention which includes a plurality of outwardly disposed, cooled fin type heat exchangers 12A, 12B and 12C disposed on the outer sides of the thermopile 10 and a plurality of centrally disposed, heated fin type heat exchangers 14 disposed between the two outer sets of cooled heat exchangers 12. Each of the heat exchangers 12A, 12B and 12C includes a base member 16A, 16B or 16C, respectively, formed from on electrically conducting material and a plurality of laterally extending fins 18 secured to and projecting outwardly from the bases 16A, 16B and 16C in a spaced, parallel array. Fins 18 are electrically conductive and are contained within a generally U-shaped housing 20 also formed from electrically conductive material. As will be appreciated from FIGS. 1 through 4, essentially three different types of cooled heat exchangers are utilized with the thermopile 10. One type of heat exchanger 12 is designated by reference character 12A and has a base member 16A sized to have secured thereto two laterally spaced layers of thermoelectric pellets 21. Each of the heat exchangers 12A is generally rectangular shaped with the fins 18 thereof extending laterally from the base in the longitudinal direction. A pair of half-sized heat exchangers 12B are provided in two corners of the upper level FIG. 3 of heat exchangers 12. The heat exchangers 12B conform exactly to the heat exchanger 12A except for their smaller size so that heat exchangers 12B receive only one layer of thermoelectric material 21 on the base 16B thereof. A third type of cooled heat exchanger is formed to bridge adjacent rows of the thermopile 10 and is designated generally by the reference character 12C. The heat exchangers 12C each have a base 16C on which is mounted a pair of spaced housing members 20C which extend laterally therefrom with the fins 18 thereof being positioned along the transverse dimension of the bases 16C. From FIGS. 1 and 4, it will be seen that the upper level of heat exchangers 12 comprises four heat exchangers 12A positioned centrally of the upper level, two heat exchangers 12B positioned in two corners of the upper level and three bridging heat exchangers 12C having bases 16C positioned to bridge adjacent rows of heat exchangers 12. The lower level of cooled heat exchangers 12 merely comprises eight heat exchangers 12A having bases 16A. As can be seen from FIGS. 1 through 3, all of the cooled heat exchangers 12 forming the upper and lower levels are formed with the fins 18 thereof extending from side to side of the thermopile 10 (i.e. from the right-hand side to the left-hand side of FIG. 1). Each of the bases 16A and 16B of heat exchangers 12A and 12C is provided with two laterally spaced layers 21 of thermoelectric material, such as bismuth telluride, which are desirably secured to the bases 16A and 16C by suitable means such as by brazing or soldering. Each of the bases 16B is provided with only one layer of thermoelectric material 21 similarly secured thereto. In the illustration of the invention of FIGS. 1, 2 and 3, it will be appreciated that each of the thermoelectric layers 21 is formed from nine pellets which are individually secured to the adjacent bases so that each set of pellets forms a separate thermoelectric layer.

Figure 4:
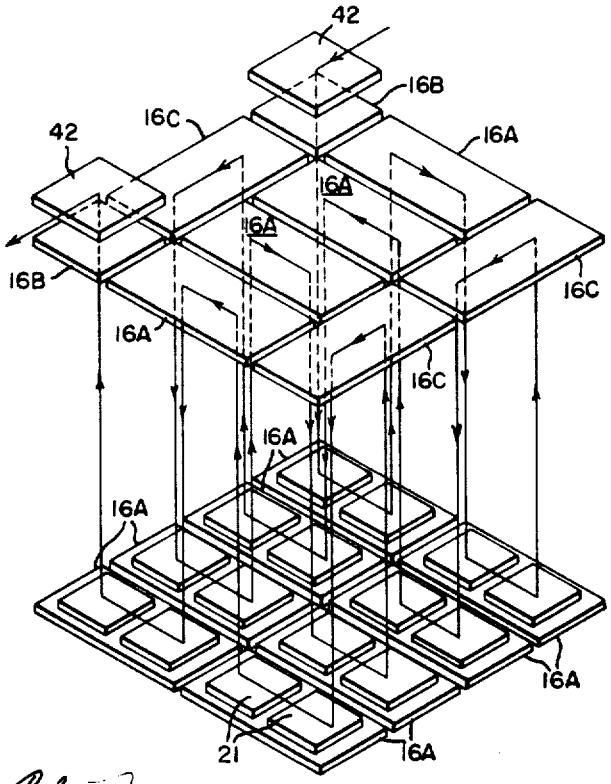
FIG. 4 is a schematic view of the electrical flow path through the thermoelectric heat exchange apparatus of FIGS. 1 to 3.

Each of the layers of thermoelectric material 21 are formed from either thermoelectrically positive or thermoelectrically negative materials with the polarities being selected to form a current flow path in thermopile 10 having thermoelectrically positive and thermoelectrically negative material therein in an alternating sequence. Accordingly, as current passes from thermoelectrically positive material to thermoelectrically negative material, heat is imparted to the structure or junction member intermediate the positive and negative materials. Similarly as current passes from thermoelectrically negative to thermoelectrically positive material, a cooling effect takes place in the heat exchange structure between the latter layers of thermoelectric material. As illustrated in FIG. 4, the current flow path in the thermopile 10 includes each of the thermoelectric layers 21 and each of the bases 16A, 16B and 16C of the heat exchangers 12A, 12B and 12C. Current passes from one of the bases 16 located at the upper level of FIG. 4 to the juxtaposed base 16 located at the lower level of FIG. 4 by a current flow path through electrically conductive heated heat exchangers 14, as will be described.

Figure 3:
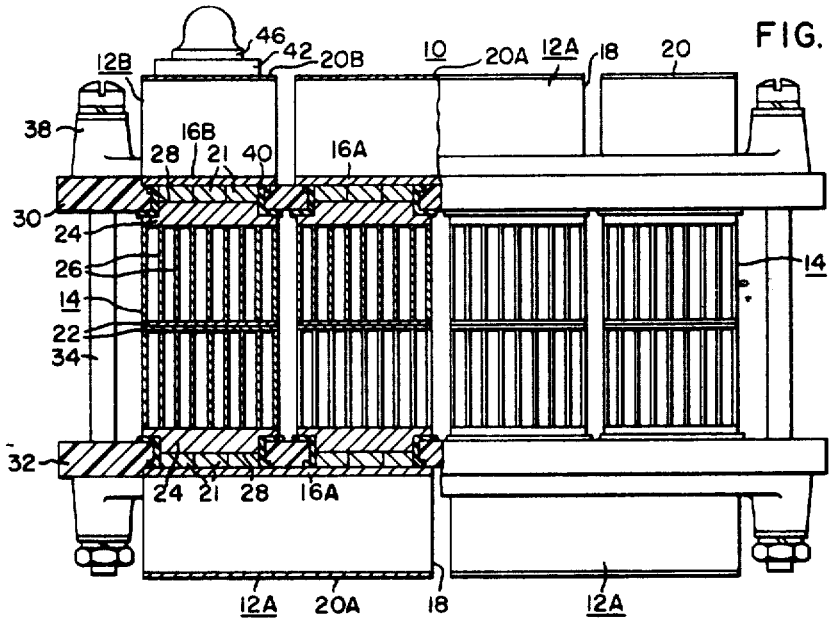
FIG. 3 is another sectional view of the thermoelectric heat exchange apparatus of FIG. 1 and taken along the lines III—III thereof.

Viewing FIG. 3, it will be seen that current passes through the heat exchange structures 12 located at the upper level in FIG. 3 to the juxtaposed heat exchange structures 12 located at the lower level through layer 21 of thermoelectric material, heat exchange structure 14 and a second thermoelectric layer 21. The heat exchange structures 14 of this illustrative embodiment of the invention are formed from two separate half-sized heat exchangers which are joined together at juxtaposed surfaces 22 by suitable means as by brazing to produce an electrically conductive joint therebetween. Each heat exchanger 14 is provided with a pair of pedestal-type bases 24 at opposed ends thereof and with a plurality of electrically conductive fins extending between adpacent bases 24 and surfaces 22. The fins 26 located in planes transverse to the planes of the fins of the heat exchangers 12 are secured at their ends to bases 24 and surfaces 22 in a manner to provide good electrical contact therebetween. The pedestal-type bases 24 of heat exchangers 14 are each formed with an outwardly extending projection 28 with the projection having a cross-sectional area exactly equal to the cross-sectional area of the thermoelectric layers 21. Each heat exchange structure 14 extends between opposed thermoelectric layers 21 and adjacent heat exchange structures 14 are maintained in insulated relationship with one another. Each of the heat exchangers 14 and 12A, 12B and 12C are fixedly positioned by a pair of spaced grid structures 30 and 32 having openings formed therein which receive the heat exchangers 12A, 12B and 12C. Grid structures 30 and 32 desirably are formed from an insulating material such as a polyester glass and are secured together by a plurality of tie bolts 34 which pass through suitably aligned openings in the grid structures 30 and 32.

Figure 1:
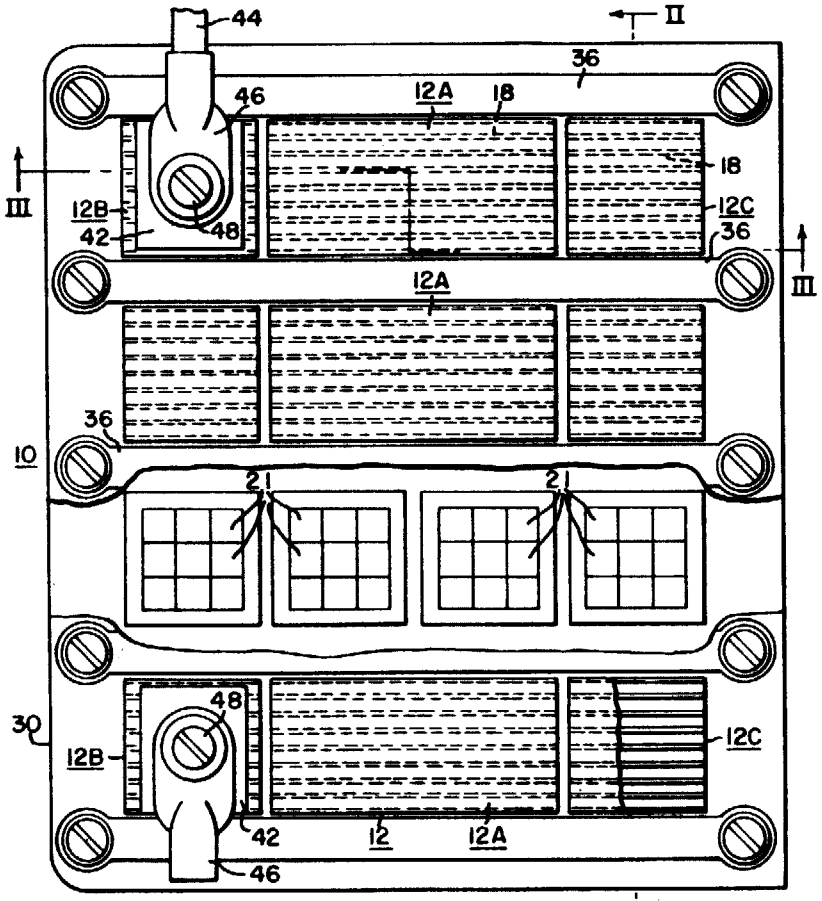
FIGURE 1 is a top plan view of an air-to-air thermoelectric heat exchange apparatus embodying the principles of this invention.

As seen in FIG. 1, a plurality of transversely extending tie rods 36 extend across the outer surfaces (from left to right) of grid structures 30 and 32 and which serve both to separate the adjacent rows of heat exchange structures 12 and to fixedly position adjacent ones of the heat exchange structure 12. Tie rods 36 desirably are formed from the same material as the grids 30 and 32 and are provided with circular projections 38 adjacent the ends thereof through which the tie bolts 34 extend. A generally moisture tight gasket 40 surrounds each of the thermoelectric layers 21 and is positioned in compression between juxtaposed bases 16 and 24 of heat exchangers 12 and 14. Each of the gaskets 40 desirably has a generally U-shaped cross-section which is shaped complementarily with adjacent portions of the grids 30 and 32 to receive the adjacent grid portions in the openings thereof. The gaskets 40 serve to prevent moisture from corroding the joints between thermoelectric layers 21 and bases 16 and 24 and also to provide shock resistance for the thermopile 10.

In an arrangement of the character described wherein a direct transfer heat exchange device is provided having no electrical insulation in the flow path, the thickness of the pellet layers 21 (also known as the pellet length in the direction of the current flow) can be substantially reduced to lengths for example on the order of 0.1 inch. A pellet thickness of such a low magnitude positioned between a pair of electrically conducting base members such as the bases 16 and 24, which have a larger cross-sectional area than the corresponding area of the pellet layers 21, increases substantially the possibility of arcing between the bases 16 and 24 in shunting relationship with the normal electrical current path of the thermopile. In order to avoid such possibilities, at least one of the bases 16 and 24 is provided with the pedestal-type projection 28 of the same cross-sectional area as the thermoelectric layer 21 to effectively increase the distance between these portions of the bases having no thermoelectric material therebetween. The provision of insulating material surrounding the pedestal projections 28 further serves to minimize the possibility of arcing.

In the example of the invention illustrated herein, the heat exchange structures 14 have a central partition 22 which provides additional rigidity to the heat exchangers 14 particularly since the latter heat exchangers are subjected to compressive forces by the tie bolts 34. It will be appreciated, however, that the fins 26 can extend directly between juxtaposed bases 24 without the use of the partitions 22.

Each of the upper surfaces of the heat exchange housings 20B desirably is provided with a terminal plate 42 fixedly secured to heat exchange structures 12B by conventional means as brazing. Each terminal plate 42 has an opening formed therein to which a lead wire 44 and terminal clamps 46 respectively are secured by conventional means such as machine screw 48. Terminal clamps 46 are adapted to be connected to a source of direct current power which produces direct currents passing through thermopile 10 along the path illustrated schematically in FIG. 4. In the event the thermopile 10 is utilized as an electrical generator of the thermoelectric type, air at different temperatures is selectively passed through heat exchangers 12 and 14 and thermoelectrically induced power is provided at terminal plates 42 by the thermopile 10.

Figure 5:
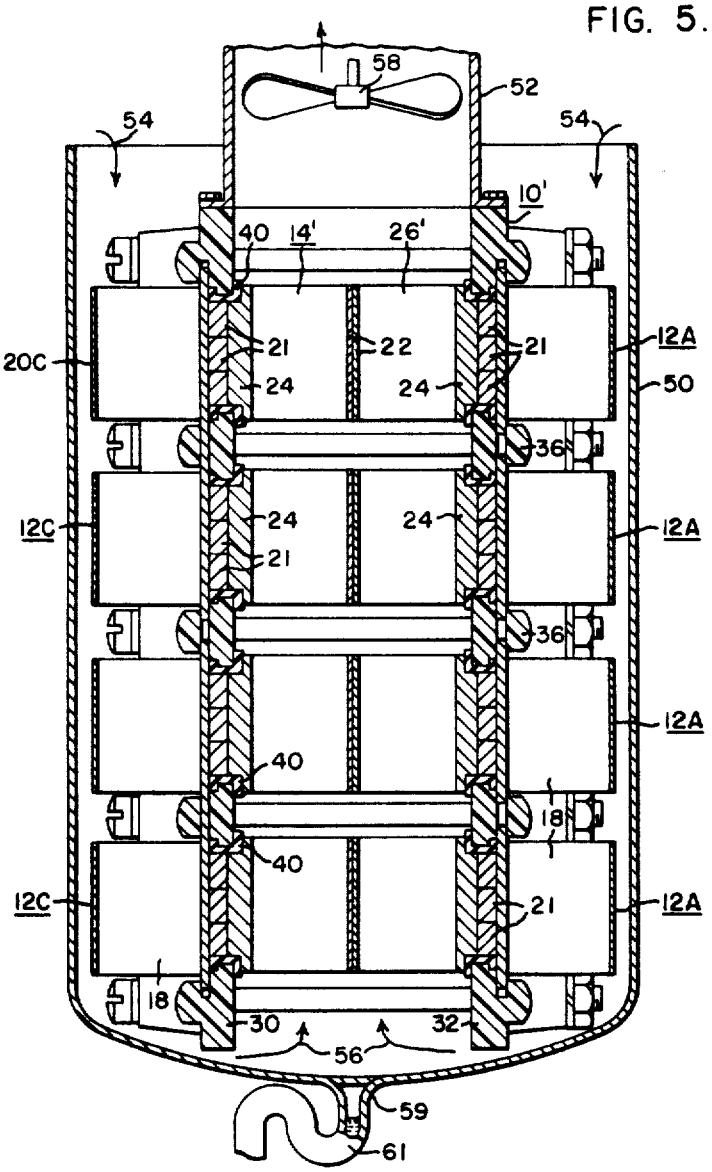
FIG. 5 is a sectional view through a modified form of air-to-air thermoelectric heat exchange apparatus and illustrated in a dehumidification application.

Referring now to the embodiment of the invention illustrated in FIG. 5, there is illustrated a modified form of the thermopile 10 of FIGS. 1 through 4 in a dehumidification application. In this connection it will be appreciated that exactly duplicated parts of the FIG. 5 embodiment will be indicated by the same reference characters and such parts will not be again described in detail. Equivalent or functionally similar parts will be indicated by primed reference characters.

In FIG. 5 a thermopile arrangement 10′ is formed having a plurality of heat exchangers 12A, 12B and 12C which are adapted to be cooled by thermoelectric layers 21. A plurality of heated heat exchange structures 14′ are formed between the two layers of cooled heat exchange structures 12 and are similar to the heat exchange structures 14 of FIGS. 1, 2 and 3 except for the positioning being of fins 26′ thereof. In FIG. 5, the fins 26′ extend parallel to the fins 18 of the heat exchangers 12. Each of the heat exchangers 12 and 14′ are fixedly positioned with the thermoelectric layers 21 secured thereto by a pair of grid structures 30 and 32. The thermopile assembly 10′ desirably is disposed in a generally cup-shaped housing 50 and is fixedly positioned therein in insulated relationship with the walls of housing 50 by suitable means (not shown). A central conduit means 52 is secured at the upper end of thermopile 10′ and desirably is shaped to conform in cross-sectional area to the upper end cross-section of the flow space through heat exchangers 14′. Accordingly, the housing structures 50 and 52 provide an inlet path for air flowing through the thermopile 10 of generally annular cross-sectional configuration with air flowing into housing 50, as illustrated by flow arrows 54. The inlet air passes through each of the heat exchange structures 12 and is cooled thereby to remove the moisture therefrom. The air flow is then directed upwardly through each of the heat exchange structures 14′ as indicated by the flow arrows 56 where it is reheated to substantially its inlet temperature and then exits from the dehumidifier through conduit 52. To assist the air circulation through the dehumidifier, an air circulating means shown schematically and referred to by reference character 58 is positioned within conduit 52 to exhaust the air in the upward direction through the conduit 52. Moisture collecting on the fins of heat exchange structures 12 forms droplets which fall to the bottom of housing 50 and are removed from housing 50 by a drain 59 formed in the lower end thereof. The drain 59 is connected to a trap 61 which prevents the flow of air into housing 50 through drain 59. By use of the annular suction flow path and central exhaust path of the dehumidifier, such dehumidifiers can be constructed of minimized size and weight and the advantages of high efficiency and low weight thermo-electric material savings can be realized from the FIG. 5 arrangement. In the application of FIG. 5, direct current is supplied to the terminals 42 (not shown) of the thermopile 10′ and the thermoelectric layers 20 are formed to provide thermoelectric cooling in the annular space between housing 50 and grid structures 30 and 32 and thermoelectric heating in the central space between grid structures 30 and 32.

Figure 6:
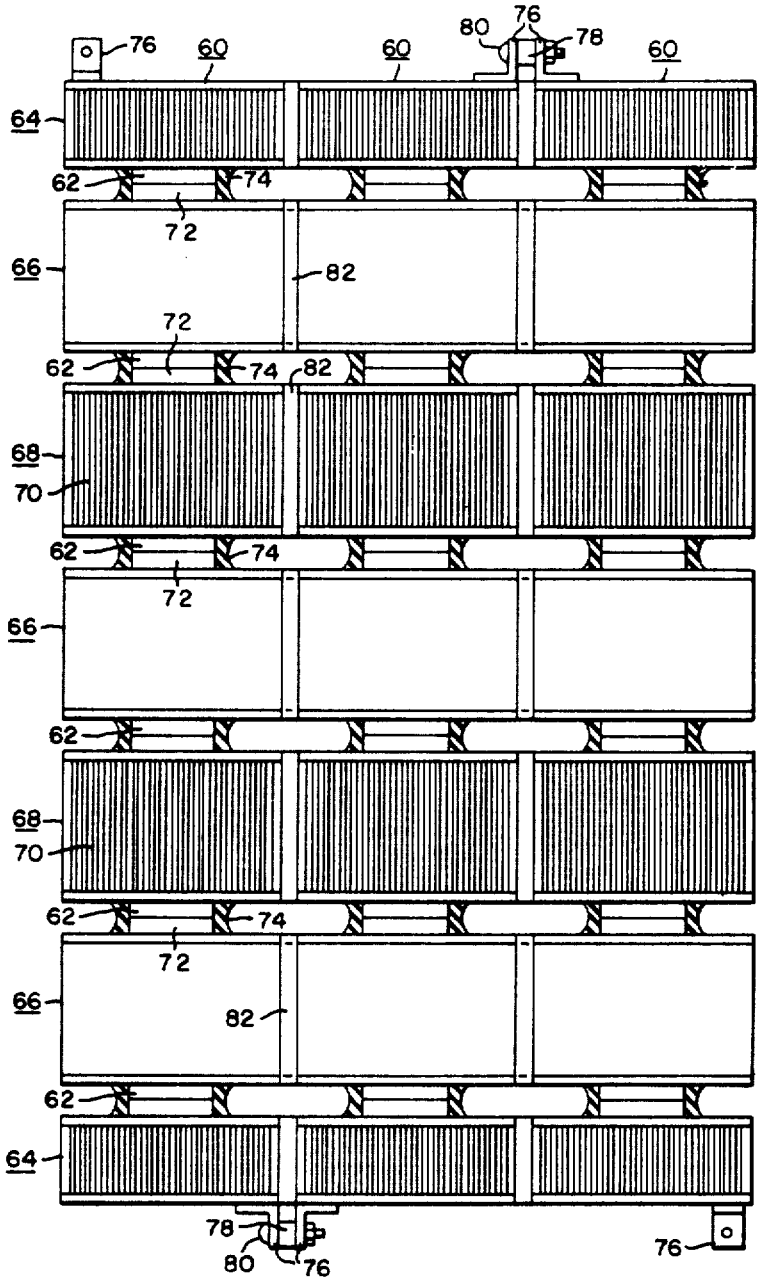
FIG. 6 is a side elevational view of a modular air-to-air thermoelectric heat exchange structure and illustrative of another embodiment of this invention.

Referring now to the embodiment of this invention illustrated in FIG. 6, it will be appreciated that the FIG. 6 arrangment provides a basic sub-module which may be grouped together into a complete module of different capacities, dependent upon the number of sub-modules, to provide a predetermined amount of thermo-electric cooling or heating for any given application. In the arrangement of FIG. 6, three vertically extending sub-modules 60 are illustrated, each submodule including six layers of thermoelectric materials 62 positioned between seven heat exchange structures in a vertical column and identified by the reference characters 64, 66 and 68. Each of the heat exchange structures 66 is adapted to be thermoelectrically cooled by the thermoelectric layer 62, while the heat exchangers 64 and 68, are adapted to be thermoelectrically heated. In furtherance of this purpose, a series current flow path is formed through the adjacent heat exchange structures 64, 66 or 68 and thermoelectric layers 62. The layers 62 are alternately formed from thermoelectrically positive and thermoelectrically negative material to produce the desired heating and cooling effects in the junction members on opposite sides thereof. Each of the thermoelectric heat exchange structures 68 are provided with a plurality of spaced fins 70 thereon which extend in FIG. 6 from the front of the thermopile to the rear, while fins (not shown) of the heat exchangers 66 extend transversely to the fins 70 (i.e. from the left of FIG. 6 to the right). The heat exchangers 64 desirably are half-sized to provide exactly half the heat transfer area as the heat exchangers 66 and 68 so that when two sub-modules 60 are joined together each adjacent pair of thermoelectric layers 62 acts to heat or cool a substantially equal effective heat transfer surface area. In FIG. 6, the thermoelectric layers 62 are secured to an adjacent base of one of the heat exchangers 64, 66 or 68. The juxtaposed surface of the other adjacent heat exchange structure is provided with a projection or pedestal 72 thereon to which the thermoelectric layer 62 is secured, which arrangement minimizes the possibility of arcing between adjacent heat exchange structures, as previously described. In addition an annular gasket 74 (shown in section in FIG. 6) surrounds the outer periphery of each thermoelectric layer 62 and pedestal 72. A terminal member designated generally by the reference character 76 is mounted on the outwardly facing surfaces of the end heat exchangers 64 and are positioned to be secured to corresponding terminals of adjacent sub-modules by suitable means such as electrically conducting transition members 78 and tie bolts 80. Terminals 76 are positioned so that corresponding rows of sub-modules 60 may be electrically connected in series. In this manner an air-to-air thermoelectric heat exchange device, or alternatively, an air-to-air thermoelectric electrical generating device of any desired size and capacity may be formed by assembling a predetermined number of sub-modules 60. Suitable means may be provided for fixedly positioning the sub-modules 60 relative to one another for example by the use of spaced layers of insulating material and tie bolts (not shown) in any conventional manner. In accordance with the invention, adjacent sub-modules 60 are mounted in electrically insulated relationship with one another either by providing a spaced relationship therebetween or by providing layers of insulating material 82 or 84 between adjacent heat exchange structures. The insulating layers 82 disirably are provided with a plurality of slots therein which conform with the spaces between the adjacent fins of the heat exchanger 66 to provide a continuous flow passageway through the modules.

It will be appreciated by those skilled in the art that many modifications may be made to the illustrative embodiments of the invention illustrated herein without departing from the broad spirit and scope thereof. Accordingly it is specifically intended that the embodiments of this invention described in detail herein be interpreted as illustrative of this invention, rather than as limitative thereof.

I claim as my invention:

[1. In a thermoelectric device, an electrically and thermally conductive heat exchanger, said heat exchanger comprising a pair or spaced base members having a plurality of spaced fins extending laterally between and joined to said base members, a layer of thermoelectric material mounted on each of said base members, one of said layers being formed from thermoelectrically positive material and the other of said layers being formed from thermoelectrically negative material, a plurality of heat exchange fins secured to each of said thermoelectric layers, terminal means connected to said last mentioned fins to form a current path serially through said fins, said thermoelectric layers and through said heat exchanger.]

[2. In a thermoelectric device, an electrically and thermally conductive heat exchanger, said heat exchanger comprising a pair of spaced base members having a plurality of spaced generally planar fins extending laterally between and joined to said base members, a layer of thermoelectric material mounted on each of said base members, one of said layers being formed from thermoelectrically positive material and the other of said layers being formed thermoelectrically negative material, a plurality of heat exchange fins secured to each of said thermoelectric layers, said last mentioned fins extending in a plane positioned laterally with respect to the plane of said heat exchanger fins, terminal means connected to said heat exchange fins for passing current serially through said fins, said thermoelectric layers and through said heat exchanger.]

[3. In a thermoelectrc device, a pair of spaced heat exchangers formed from electrically and thermally conductive material, each of said heat exchangers including a base member and a plurality of spaced heat exchange fins extending laterally from said base member, a layer of thermoelectric material secured to a surface on each of said base members, a heat exchange means including a plurality of electrically conducting fins thereon mounted in bridging relationship between said layers of thermoelectric material, whereby a series current flow path is surfaces, and a layer of thermoelectric material of the formed through said heat exchangers, said thermoelectric layers and said heat exchange means ]

[4. In a thermoelectric device, a pair of electrically and thermally conductive heat exchangers, said heat exchangers being positioned in spaced relationship and each having one surface thereof mounted in opposed relationship, one of said last mentioned surfaces having a projection extending outwardly therefrom toward the other of said surfaces, said projection having a smaller cross-sectional area than the cross-sectional area of said same cross-sectional area as said projection secured to said projection and to said other surface in electrically conductive relationship therewith.]

[5. In a thermoelectric device, a pair of electrically and thermally conductive heat exchangers, said heat exchangers being positioned in spaced relationship and each having one surface thereof mounted in opposed relationship, one of said last mentioned surfaces having a projection extending outwardly therefrom toward the other of said surfaces, said projection having a smaller cross-sectional area than the cross-sectional area of said surfaces, and a layer of thermoelectric material of the same cross-sectional area as said projection secured to said projection and to said other surface in electrically conductive relationship therewith, an insulating means filling the remainder of the spacing between said opposed surfaces.]

6. In a thermoelectric dehumidifier, a generally cup-shaped vessel, a thermoelectric heat exchanger disposed in said vessel, said heat exchanger comprising at least three heat transfer means mounted in tandem *forming a central and two outer heat transfer means* and having thermoelectric material positioned between *and secured to* adjacent ones of said heat transfer means, said thermoelectric material being of a polarity to induce thermoelectric cooling in the outer ones of said heat transfer means and thermoelectric heating in the central one of said heat transfer means, conduit means extending through the open end of said cup-shaped vessel and connected to said central heat transfer means, said vessel and said conduit means forming an annular intake flow path to transmit air into communication with said [cooled] *outer* transfer means, *and* said inlet air supply exiting from said vessel through said central heat transfer means and said conduit.

[7. In a thermoelectric device, a first and a second heat exchanger, each of said heat exchangers comprising a pair of spaced base members said a plurality of heat exchange fins extending laterally between and secured to each of said base members, a pair of layers of thermoelectric material secured to said heat exchangers and mounted on said base members thereof respectively, a first heat transfer means comprising a base member and a plurality of laterally extending fins secured to one of said thermoelectric layers of said first heat exchanger, a second heat transfer means comprising a base member and a plurality of laterally extending heat transfer fins secured to one of said thermoelectric layers of said second heat exchanger, a third heat transfer means comprising a base member secured in bridging relationship to the others of said thermoelectric layers of said first and said second heat exchangers, said third heat transfer means having a plurality of spaced fins extending laterally from said base member, and terminal means connected to said first and said second heat transfer means.]

[8. In a thermoelectric heating and cooling device, a first and a second heat exchanger, each of said heat exchangers comprising a pair of spaced base members and a plurality of laterally extending heat exchange fins secured to each of said base members, a pair of layers of thermoelectric material secured to each of said heat exchangers and mounted on said base members, respectively, a first heat transfer means comprising a base member and a plurality of laterally extending fins secured to one of said thermoelectric layers of said first heat exchanger, a second heat transfer means comprising a base member and a plurality of laterally extending heat transfer fins secured to one of said thermoelectric layers of said second heat exchanger, a third heat transfer means comprising a base member secured in bridging relationship to the others of said thermoelectric layers of said first and said second heat exchangers, said third heat transfer means having a plurality of spaced fins extending laterally from said base member, and terminal means connected to said first and said second heat transfer means, said thermoelectric material being chosen of a polarity so as to provide one of the conditions of thermoelectric heating and thermoelectric cooling to both said first and said second exchangers and to induce the other of said conditions of thermoelectric heating and thermoelectric cooling to each of said first, second and third heat transfer means.]

*9. The thermoelectric dehumidifier of claim 6 wherein said central heat transfer means includes a pair of spaced electrically conducting base members and a plurality of electrically conducting generally planar central fins extending between and secured to said base members, and a layer of thermoelectric material coupled electrically and in heat exchange relationship with each of said base member.*

*10. The thermoelectric dehumidifier of claim 9 wherein said two outer heat transfer means each includes an electrically conducting outer base member, each outer base member being electrically coupled and in heat exchange relationship with the respective adjacent layer of thermoelectric material.*

*11. The thermoelectric dehumidifier of claim 10 wherein each of said outer base members includes a plurality of generally planar electrically conducting outer fins secured thereto and extending outwardly therefrom in a direction away from said central heat transfer means, the planes of said outer fins being substantially parallel to the plane of said central fins.*

*12. In a thermoelectric dehumidifier, a generally cup-shaped vessel, a thermoelectric heat exchanger disposed in said vessel, said heat exchanger comprising at least three heat transfer means mounted in tandem forming a central and two outer heat transfer means and having thermoelectric material positioned between and secured to adjacent ones of said heat transfer means, said thermoelectric material being of a polarity to induce one of the conditions of thermoelectric heating and thermoelectric cooling in the outer ones of said heat transfer means and the other of the conditions of thermoelectric cooling and thermoelectric heating in the central one of said heat transfer means, conduit means extending through the open end of said cup-shaped vessel and connected to said central heat transfer means, said vessel and said conduit means forming an intake flow path to transmit air into communication with the ones of said heat transfer means being thermoelectrically cooled, and said inlet air supply exiting from said vessel through the ones of said heat transfer means being thermoelectrically heated.*

*13. The thermoelectric dehumidifier of claim 12 wherein said central heat transfer means includes a pair of spaced electrically conducting base members and a plurality of electrically conducting generally planar central fins extending between and secured to said base members, and a layer of thermoelectric material coupled electrically and in heat exchange relationship with each of said base members.*

*14. The thermoelectric dehumidifier of claim 13 wherein said two outer heat transfer means each includes an electrically conducting outer base member, each outer base member being electrically coupled and in heat exchange relationship with the respective adjacent layer of thermoelectric material.*

*15. The thermoelectric dehumidifier of claim 14 wherein each of said outer base members includes a plurality of generally planar electrically conducting outer fins secured thereto and extending outwardly therefrom in a direction away from said central heat transfer means, the planes of said outer fins being substantially parallel to the plane of said central fins.*

References Cited

The following references, cited by the Examiner, are of record in the patented file of this patent or the original patent.

UNITED STATES PATENTS

| | | | |
|---|---|---|---|
| 2,949,014 | 8/1960 | Belton | 62—3 |
| 3,024,616 | 3/1962 | Bury | 62—3 |
| 3,040,538 | 6/1962 | Alsing | 62—3 |
| 3,077,080 | 2/1963 | Pietsch | 62—3 |
| 3,126,710 | 3/1964 | Boehmer | 62—3 |
| 3,137,142 | 6/1964 | Venema | 62—3 |
| 2,944,404 | 7/1960 | Fritts | 62—3 |
| 3,036,383 | 5/1962 | Edwards | 62—3 |
| 3,095,709 | 7/1963 | Demand | 62—3 |

WILLIAM J. WYE, *Primary Examiner.*

U.S. Cl. X.R.

62—90